United States Patent
Nakka et al.

(10) Patent No.: US 9,842,776 B2
(45) Date of Patent: Dec. 12, 2017

(54) INTEGRATED CIRCUITS AND MOLDING APPROACHES THEREFOR

(71) Applicant: NXP B.V., Eindhoven (NL)

(72) Inventors: John Suman Nakka, Eindhoven (NL); Tonny Kamphuis, Nijmegen (NL); Roelf Anco Jacob Groenhuis, Nijmegen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/994,590

(22) Filed: Jan. 13, 2016

(65) Prior Publication Data

US 2017/0200646 A1 Jul. 13, 2017

(51) Int. Cl.
| | |
|---|---|
| *H01L 21/78* | (2006.01) |
| *H01L 21/02* | (2006.01) |
| *H01L 23/31* | (2006.01) |
| *H01L 21/304* | (2006.01) |
| *H01L 21/56* | (2006.01) |
| *H01L 21/683* | (2006.01) |
| *H01L 23/00* | (2006.01) |
| *H01L 23/544* | (2006.01) |

(52) U.S. Cl.
CPC ........ *H01L 21/78* (2013.01); *H01L 21/02013* (2013.01); *H01L 21/02016* (2013.01); *H01L 21/304* (2013.01); *H01L 21/561* (2013.01); *H01L 21/565* (2013.01); *H01L 21/6836* (2013.01); *H01L 23/3114* (2013.01); *H01L 23/3135* (2013.01); *H01L 23/544* (2013.01); *H01L 23/562* (2013.01)

(58) Field of Classification Search
CPC ... H01L 21/304; H01L 21/561; H01L 21/565; H01L 21/6836; H01L 23/3135; H01L 23/544; H01L 23/562; H01L 23/3114; H01L 21/02013; H01L 21/02016
See application file for complete search history.

(56) References Cited

U.S. PATENT DOCUMENTS

| | | | |
|---|---|---|---|
| 5,994,783 A * | 11/1999 | You | H01L 23/3107 257/712 |
| 8,535,978 B2 * | 9/2013 | Scanlan | H01L 21/56 257/686 |
| 8,729,679 B1 | 5/2014 | Phua | |
| 9,196,537 B2 | 11/2015 | Van Gemert et al. | |
| 2014/0110842 A1 * | 4/2014 | Zenz | H01L 23/31 257/738 |
| 2014/0145294 A1 | 5/2014 | Moeller et al. | |

(Continued)

*Primary Examiner* — Daniel Luke
*Assistant Examiner* — Khatib Rahman (57) ABSTRACT

Integrated circuit dies within a semiconductor wafer are separated using an approach that may facilitate mitigation of warpage, cracking and other undesirable aspects. As may be implemented in accordance with one or more embodiments, a semiconductor wafer is provided with a plurality of integrated circuit dies and first and second opposing surfaces, and with the second surface of the wafer being ground. A first mold compound is applied to the ground second surface, and the integrated circuit dies are separated along saw lanes while using the first mold compound to hold the dies in place. The integrated circuit dies are encapsulated with the mold compounds, by applying the second mold compound to the first surface and along sidewalls of the integrated circuit dies.

18 Claims, 7 Drawing Sheets

(56) References Cited

U.S. PATENT DOCUMENTS

2015/0155248 A1* 6/2015 Lin .................. H01L 21/76879
　　　　　　　　　　　　　　　　　　　　　　257/737
2015/0243575 A1* 8/2015 Strothmann ........ H01L 23/3114
　　　　　　　　　　　　　　　　　　　　　　257/773

* cited by examiner

INTEGRATED CIRCUITS AND MOLDING APPROACHES THEREFOR

OVERVIEW

Aspects of the present disclosure relate to apparatuses, devices, and methods for the separation of integrated circuit dies.

Integrated circuits (ICs) can be produced by forming a plurality of ICs on a semiconductor substrate, such as silicon. The ICs include one or more layers formed on the substrate (e.g., semiconductor layers, insulative layers, and metallization layers). The individual ICs are separated by lanes. The finished ICs on the wafer are then separated into individual ICs by, for instance, sawing the wafer along the lanes. Separation of the wafer into individual ICs may be referred to as dicing. Sawing may be performed using various mechanical cutting and laser cutting methods.

For many applications, it is desirable to incorporate a large number of electronic devices into a single silicon wafer. One such application involves molding a wafer level chip scale package (WLCSP) that can save valuable space, which is particularly useful for mobile devices such as phones, computers, media players, and hand-held controllers. However, as the number of electronic devices per given area of the silicon wafer increases, the manufacturing process becomes more difficult. In addition, WLCSP components can be subject to cracking or other stresses. These and other aspects present challenges to the manufacture and implementation of integrated circuits, such as those involving WLCSP.

SUMMARY

Aspects of the present disclosure relate to separation of IC dies from a silicon wafer. As may be implemented in accordance with one or more embodiments, a semiconductor wafer is provided with a plurality of integrated circuit dies, with the wafer having first and second opposing surfaces. The second surface of the wafer is ground, and a first mold compound is applied to the ground second surface. The integrated circuit dies are separated along saw lanes while using the first mold compound to hold the dies in place. After separation, the integrated circuit dies are encapsulated with the mold compounds by applying the second mold compound to the first surface and along sidewalls of the integrated circuit dies. The mold compound may be formed or ground to respective thicknesses that are about equal, or that otherwise provide similar stiffness. In some implementations, a thickness of the semiconductor wafer is reduced by grinding the second surface of the wafer, while using an adhesive material such as tape on the first surface of the wafer to support the wafer. The first mold compound can be applied in such a manner as to mitigate warpage of the wafer, such as by setting a stiffness of the first mold compound to provide balanced support respectively to the first and second surfaces of the wafer, relative to stiffness of the adhesive material. This approach can provide balanced support respectively to the first and second surfaces of the wafer.

Other embodiments are directed to a method as follows. An adhesive material is affixed to a first surface of a semiconductor wafer having a plurality of integrated circuit dies, in which the semiconductor wafer has a second surface opposite the first surface and a thickness between the first and second surfaces. The thickness of the semiconductor wafer is reduced by grinding the second surface of the semiconductor wafer while using the adhesive material to support the first surface of the semiconductor wafer. After grinding the second surface, a first mold material is molded onto the second surface while using the adhesive material to support the first surface of the semiconductor wafer. After molding the first mold material on to the second surface, the integrated circuit dies are separated while using the first mold material to support the integrated circuit dies. After separating the integrated circuit dies, a second mold material is molded on the first surface of the wafer.

Another embodiment is directed to an apparatus as follows. A semiconductor wafer has a plurality of integrated circuit dies and first and second opposing surfaces, with the second surface of the wafer having been ground and the integrated circuit dies having been separated along saw lanes therebetween. A first mold compound is molded to the ground second surface and configured and arranged to hold the integrated circuit dies in place. A second mold compound is located on the first surface and along sidewalls of the integrated circuit dies, including sidewalls in the saw lanes, and is configured and arranged with the first mold compound to encapsulate the integrated circuit dies. In some implementations, the second mold compound extends between the plurality of integrated circuit dies and into a portion of the saw lanes extending into the first mold compound.

While the disclosure is amenable to various modifications and alternative forms, specifics thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims.

BRIEF DESCRIPTION OF FIGURES

Aspects of the present disclosure may be more completely understood in consideration of the detailed description of various embodiments of the present disclosure that follows in connection with the accompanying drawings, in which.

While the disclosure is amenable to various modifications and alternative forms, specifics thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure relate to a semiconductor wafer and integrated circuits (ICs) therein, such as thin WLCSPs. Various embodiments are directed to separating ICs in a semiconductor wafer, utilizing adhesive material (e.g., tape, glue, cement) and molding to mitigate physical damage. While not being necessarily limited, certain embodiments of the instant disclosure are directed to applications involving the manufacture of very thin ICs, such as ICs having a thickness of less than 100 µm or about 50 µm, while mitigating warpage and other issues that may occur with such thin structures. Support is provided to the wafer while it undergoes processing, by balancing support/force provided on opposing surfaces of the wafer with adhesive material, molding and/or a combination thereof. Resulting package thicknesses can be reduced (e.g., to 150 µm or less) while providing reliable ICs via the manufacturing approach involving the mitigation of warpage, cracking and other issues.

Various embodiments are directed to molding semiconductor dies in a semiconductor wafer, such as dies in a thin WLCSP. These approaches can facilitate decreasing mold cap and silicon wafer thicknesses below 50 µm, while mitigating warpage, cracking and/or other undesirable effects. For instance, total thickness of a resulting WLCSP can be provided at less than about 150 µm, such as with about 50 µm of mold cap on top and bottom sides of a 50 µm thick silicon die. Certain embodiments involve obtaining protection on all sides (e.g., 6-side protection) for dies in the wafer.

Accordingly, various embodiments are directed to addressing challenges, including those noted in the Background section above, relating to the integrity of integrated circuit dies. These approaches may thus involve mitigation of warpage, cracking and other physical damage, and may achieve protection of the integrated circuit dies via encapsulation. In this context, silicon (or other materials) in a wafer and/or die format, bumped or non-bumped, can be brittle and is thus protected from external loading as may relate to mechanical, thermal, moisture and other conditions. In particular, various embodiments are directed to molding thin (e.g., less than 100 µm) integrated circuit dies on all sides using an approach and/or configuration that mitigates warpage that may, for example, result from differences in the coefficient of thermal expansion (CTE) between the material of the integrated circuit die and molding compound used to encapsulate the dies. Further, various embodiments facilitate singulation (or dicing) of thin (less than 100 µm) semiconductor wafers, while mitigating cracking and other damage that can occur during singulation or subsequent handling, via the molding.

In accordance with certain embodiments, adhesive material and encapsulation are implemented in a manner that facilitates the formation of integrated circuit dies. These approaches can facilitate the formation of very thin wafer-level packages, while mitigating or eliminating warpage effects. In accordance with one or more embodiments, adhesive material is affixed to a first surface of a semiconductor wafer having a plurality of integrated circuit dies and a second surface opposite the first surface. The adhesive material may, for example, be affixed to electrical contacts protruding from a substrate of the wafer. The thickness of the semiconductor wafer is reduced by grinding the second surface of the semiconductor wafer while using the adhesive material to support the semiconductor wafer via the first surface. This reduction may, for example, involve creating a very thin wafer, such as may be less than a thickness of the adhesive material. A first mold material (e.g., epoxy) is molded onto the second surface while using the adhesive material to support the first surface of the semiconductor wafer and the integrated circuit dies are separated thereafter, using the first mold material to support the integrated circuit dies. Separation may be carried out, for example, after removing the adhesive material, or before removing the adhesive material in which the adhesive material may support the wafer while undergoing separation. After the integrated circuit dies are separated, a second mold material is molded on the first surface of the wafer. The respective mold materials can thus be implemented to encapsulate individual dies, as may be implemented with wafer-level chip scale packaging.

Warpage of the wafer is mitigated using a variety of approaches, to suit particular embodiments, applications and/or available materials. In some embodiments, the first mold material is ground to a thickness based upon a stiffness and thickness of the adhesive material. This approach can be used to balance support provided to the second surface by the first mold material, with support provided to the first surface by the adhesive material. In other embodiments, the first mold material is provided with a thickness and stiffness based upon a stiffness and thickness of the adhesive material, therein balancing support provided to the second surface by the first mold material with support provided to the first surface by the adhesive material. Affixing the adhesive material and molding the first mold material may be carried out for mitigating wafer warpage by balancing support provided to the second surface by the first mold material with support provided to the first surface by the adhesive material, via respective thicknesses and stiffness of the adhesive material and of the first mold material (e.g., and depending upon characteristics of the adhesive material and molding material). In some embodiments, stiffness and thickness of the adhesive material are selected based upon stiffness and thickness of the first mold material to be applied, therein balancing support provided to the first surface by the adhesive material with support provided to the second surface by the first mold material. These (and other) approaches can be useful, for example, where the adhesive and mold materials have coefficients of thermal expansion (CTE) that are about equal, yet different than a CTE of the wafer.

The integrated circuit dies may be separated in a variety of manners. In some embodiments, the integrated circuit dies are separated while using the first mold material to hold the integrated circuit dies in place while sawing/cutting the wafer, therein mitigating warpage and cracking of the integrated circuit dies. In certain embodiments, the wafer is sawed through along saw lanes between the integrated circuit dies, without sawing through the first mold material. With this approach, the first mold material can be used to hold the integrated circuit dies in place after sawing.

Molding may be carried out in a variety of manners. In accordance with some embodiments, the first and second mold materials are used to encapsulate the integrated circuit dies with an epoxy mold compound, with the second mold material being molded along sidewalls the integrated circuit dies and in gaps in the wafer created by the separating. In certain implementations, the second mold material is formed in saw lanes between the integrated circuit dies and extending into the first mold material.

Turning now to the Figures, FIGS. 1A-1E show a semiconductor apparatus including a semiconductor wafer 110 having IC dies, at various points of manufacture, in accordance with one or more embodiments. At FIG. 1A, a tape 120 is applied to an upper surface 111 of the semiconductor wafer 110. At FIG. 1B, a lower surface 112 of the semiconductor wafer 110 has been thinned, such as by grinding, while using the tape 120 to support the wafer. This approach may involve, for example, grinding the semiconductor wafer 110 to a thickness that renders the resulting semiconductor wafer susceptible to warping. For instance, in various embodiments the semiconductor wafer 110 is thinned to a thickness of about 50 µm or less, which can facilitate the formation of a WLCSP having a thickness of about 150 µm with 50 µm of mold compound on opposing surfaces of the wafer. This approach may, for example, involve beginning with a semiconductor wafer 110 having a much greater thickness, such as 770 µm. The thickness of the tape 120 can be, for example, about 330 µm or greater. By supporting the wafer, process steps relating to the mitigation of warpage, such as reheating the wafer, can be avoided.

Figure 1A:
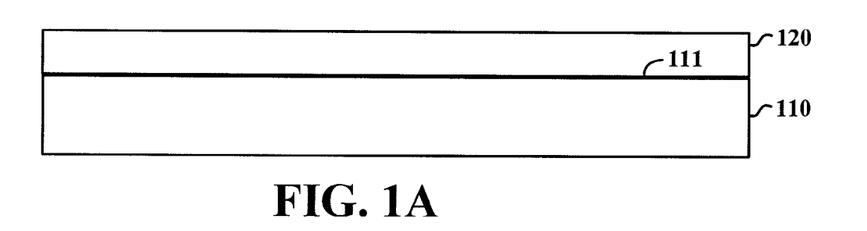
FIGS. 1A-1E show a semiconductor wafer having IC dies at various points of manufacture, in accordance with one or more embodiments.
Figure 1B:
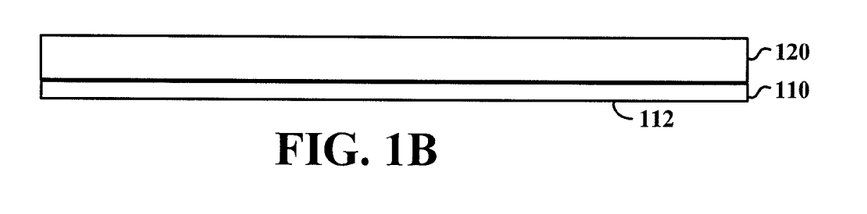
Figure 1C:
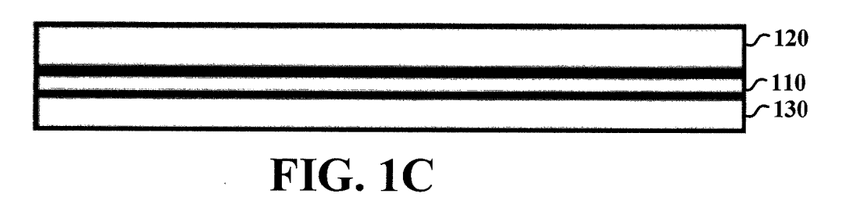

In FIG. 1C, a mold material 130, such as an epoxy mold compound, has been molded to the lower surface 112 of the semiconductor wafer 110, and operates with the tape 120 to support the semiconductor wafer. For instance, the semiconductor wafer may be subjected to thermal stress that tends to warp the wafer during and/or subsequent to molding. The tape 120 and mold material 130 provide support for the respective surfaces of the wafer, to counter warping tendencies. The mold material 130 may also be ground at this stage, to set the thickness as shown.

Figure 1D:
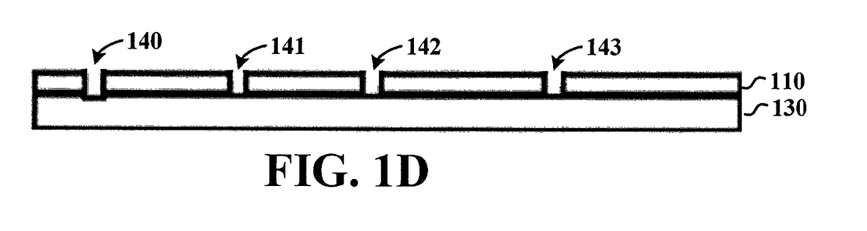

In FIG. 1D, the heat resistant tape has been removed and saw lanes 140, 141, 142 and 143 have been formed in the semiconductor wafer 110. The tape may be removed before or after creating the saw lanes. In some implementations the mold material is ground to the resulting thickness shown after cutting of the saw lanes, therein utilizing a thicker mold material for supporting the semiconductor wafer 110 during cutting. In some instances where the wafer would otherwise warp toward the mold material 130, the mold material is ground before making the saw lanes 140, 141, 142 and 143 to stave off such warping. In some instances, the saw lanes are formed deeper than shown, extending partially into or through the mold material 130.

Figure 1E:
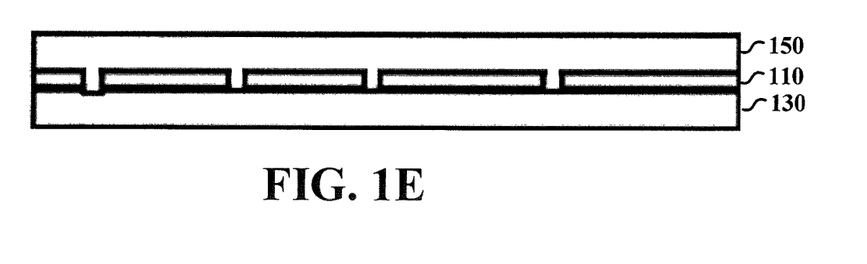

In FIG. 1E, mold material 150 has been formed on the upper surface 111 and, by way of example, is shown extending down through the saw lanes 140, 141, 142 and 143. The thickness of the mold material 150 can be set relative to that of the mold material 130, to provide balanced support to the upper and lower surfaces 111 and 112 of the semiconductor wafer 110. In some implementations, the mold material 150 can be provided at a thickness that is thin enough to facilitate visualization of the saw lanes 140, 141, 142 and 143 through the mold material.

In various implementations, the mold material 130 and 150 can be ground to set a common mold material thickness on opposing sides of the semiconductor wafer 110, as shown in FIG. 1E. This approach may involve alternately grinding the mold material 130 and 150 in multiple stages per surface to mitigate warpage.

Support provided by the tape 120 and mold material 130 can be utilized in a variety of manners. Embodiments may involve, for example, setting thicknesses and/or stiffness of the tape 120 and/or mold material 130 relative to one another. In certain embodiments, the mold material 130 may be ground or otherwise thinned to achieve a thickness that provides resulting support to the lower surface 112 that matches support provided by the tape to the upper surface 111. This approach balances forces applied by the tape 120 and mold material 130 to the semiconductor wafer 110, and therefor helps to prevent the wafer from warping. Other embodiments involve selecting a material or thickness of the tape 120 based upon a known design thickness and material of the mold material 130, to balance forces applied to the semiconductor wafer 110 upon completion of the application of the mold material 130. Similarly, the type of mold material 130 can be chosen relative to the tape 120 to balance forces. As such, warpage can be balanced by selecting stiffer tape and/or varying the thickness of the mold material 130. The variation of the mold material thickness can be done during molding by forming the mold material 130 to a desired thickness, or by grinding the mold material after molding. Utilizing the tape, circular grinding can be implemented as well. In various implementations, the mold material 130 and/or 150 can be implemented with an overall size that is larger than the semiconductor wafer 110.

Figure 2A:
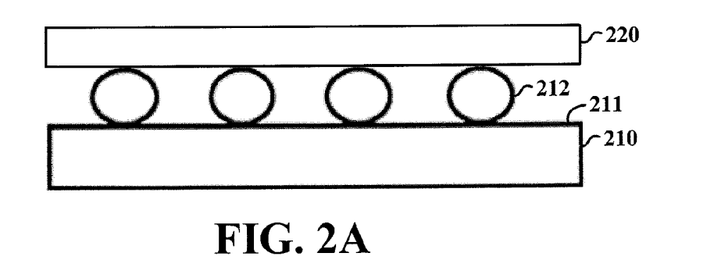
FIGS. 2A-2E show a bumped semiconductor wafer having IC dies at various points of manufacture, in accordance with one or more embodiments.
Figure 2B:
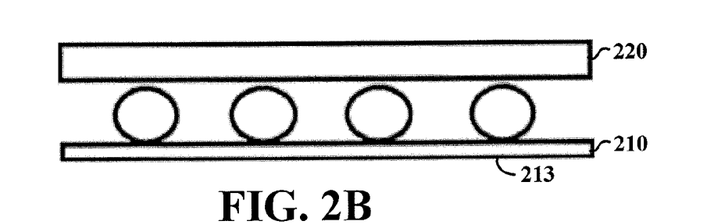
Figure 2C:
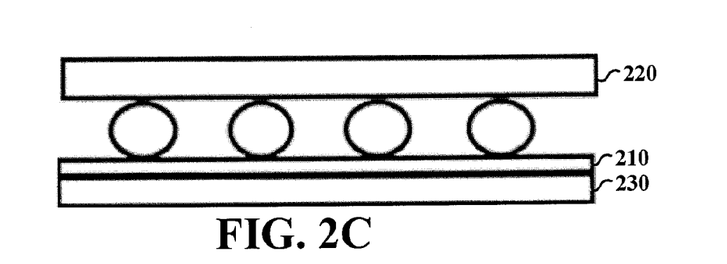

FIGS. 2A-2E show a bumped semiconductor apparatus including a semiconductor wafer 210, at various stages of manufacture, in accordance with one or more embodiments. The apparatus may, for example, be formed in a manner similar to that characterized with FIGS. 1A-1E above. Beginning with FIG. 2A, a tape 220 is applied to contacts 212 (e.g., connector balls) at an upper surface 211 of the semiconductor wafer 210. At FIG. 2B, a lower surface 213 of the semiconductor wafer 210 has been thinned while using the tape 220 to support the wafer. In FIG. 2C, a mold material 230 has been molded to the lower surface 213 of the semiconductor wafer 210, and operates with the tape 220 to support the semiconductor wafer. For instance, the semiconductor wafer may be subjected to thermal stress that tends to warp the wafer during and/or subsequent to molding. The tape 220 and mold material 230 provide support for the wafer.

Figure 2D:
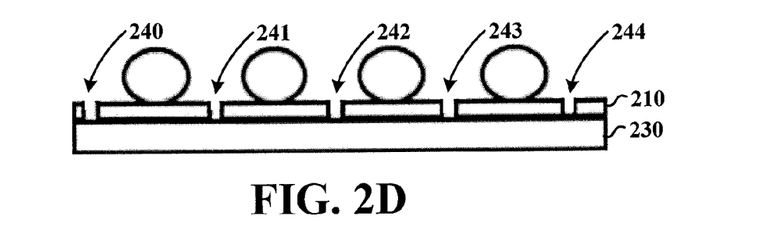
Figure 2E:
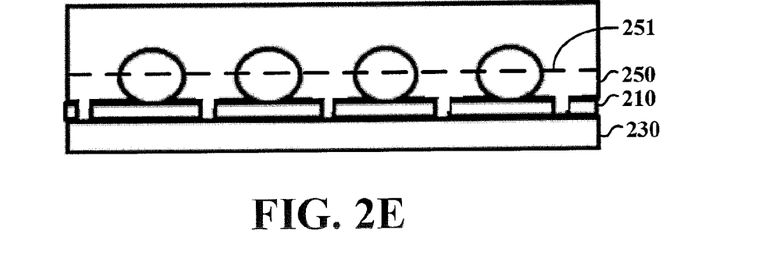

In FIG. 2D, the heat resistant tape has been removed and saw lanes 240, 241, 242, 243 and 244 have been formed in the semiconductor wafer 210. The saw lanes may be created, for example, using a wet etch, a dry etch or a cutting approach such as laser cutting or physical cutting. The tape may be removed before or after creating the saw lanes. The mold material 230 can be ground to the resulting thickness shown before or after cutting of the saw lanes, with the latter utilizing a thicker mold material for supporting the semiconductor wafer 210 during cutting. In some instances, the saw lanes are formed deeper than shown, extending partially into or through the mold material 230. In FIG. 2E, mold material 250 has been formed on the upper surface 211, around the contacts 212 and, by way of example, extending down through the saw lanes 240, 241, 242, 243 and 244. The thickness of the mold material 250 can be set relative to that of the mold material 230, to provide balanced support to the semiconductor wafer 210. For instance, in some embodiments the mold material 250 and the contacts 212 are ground to a level as shown by dashed line 251, with portions of the apparatus above the dashed line being removed.

Figure 3:
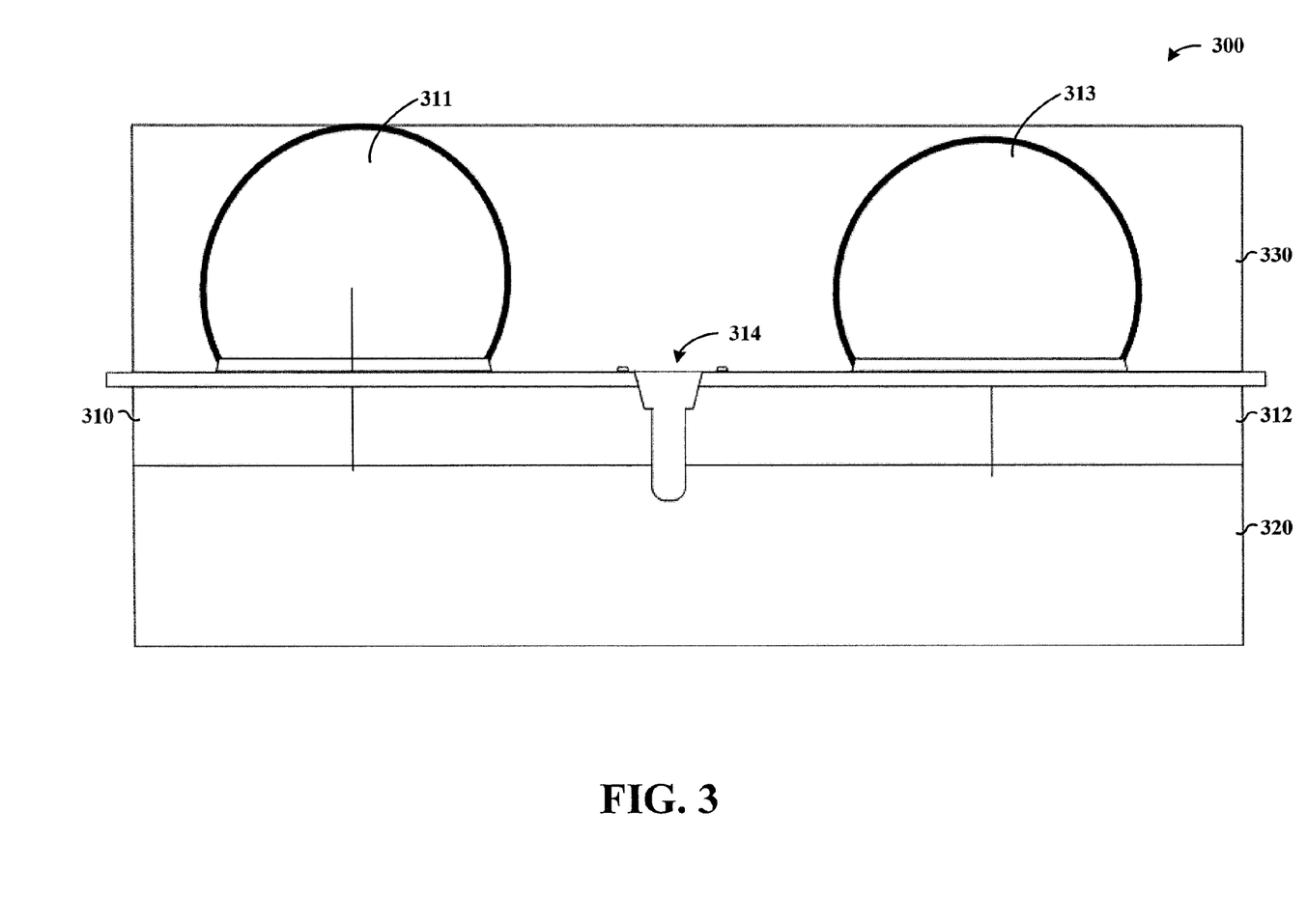
FIG. 3 shows a cross-section of an apparatus having respective integrated circuit dies at a stage of manufacture, in accordance with another embodiment.

FIG. 3 shows a cross-section of an apparatus 300 having respective integrated circuit dies at a stage of manufacture, in accordance with another embodiment. The cross-section shows two integrated circuit dies 310 and 312 that have been separated via sawing at a saw lane 314, as may be carried out using one or more approaches as characterized herein. A mold material 320 is molded to a lower surface of the integrated circuit dies, prior to creation of the saw lane 314 that extends into the mold material (e.g., with the mold material being used to support an entire wafer of such dies). Contacts 311 and 313 are encapsulated in an upper mold material 330, which also fills the saw lane 314.

Figure 4:
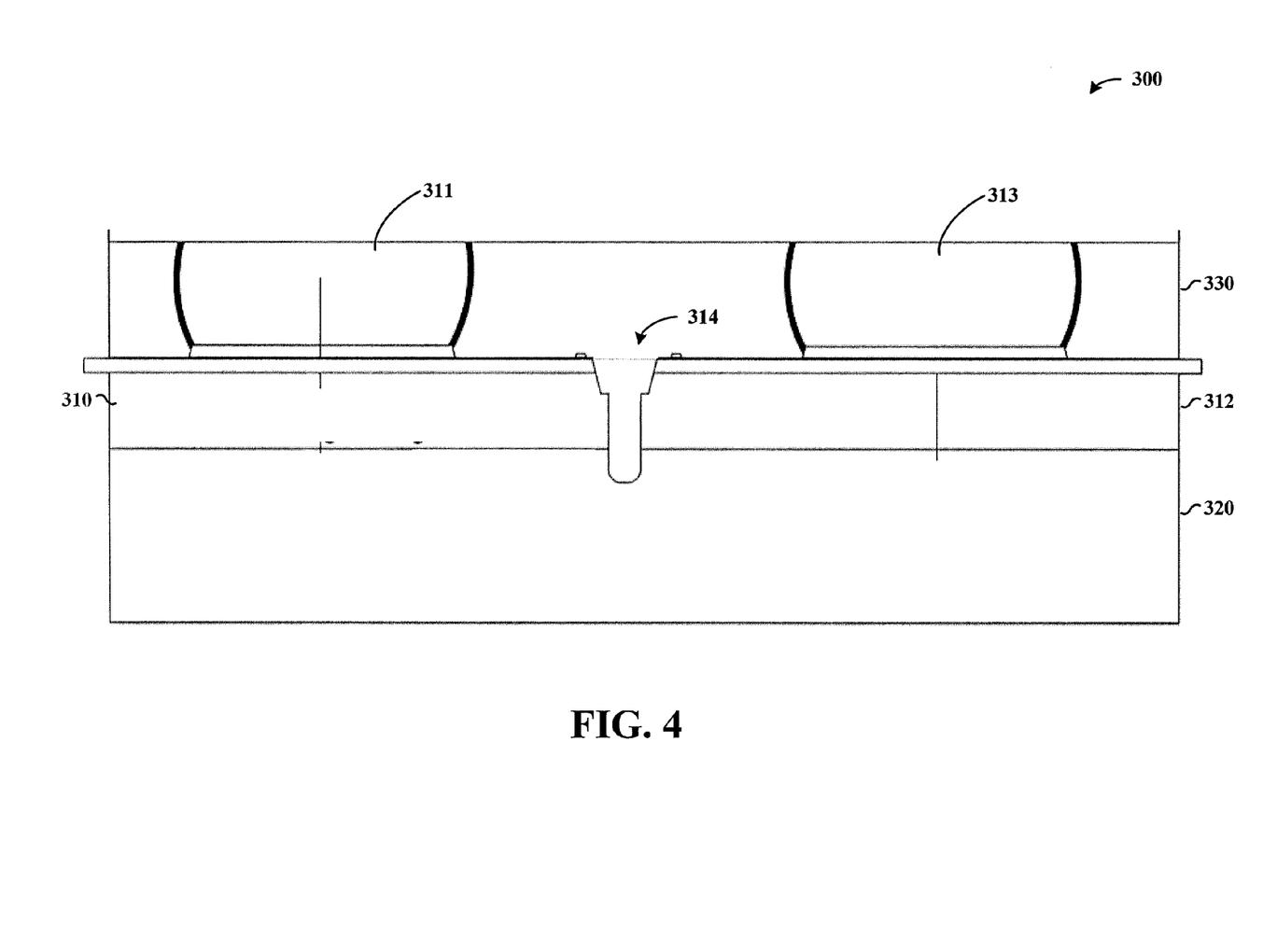
FIG. 4 shows the apparatus of FIG. 3 at another stage of manufacture, in accordance with one or more embodiments.
Figure 5:
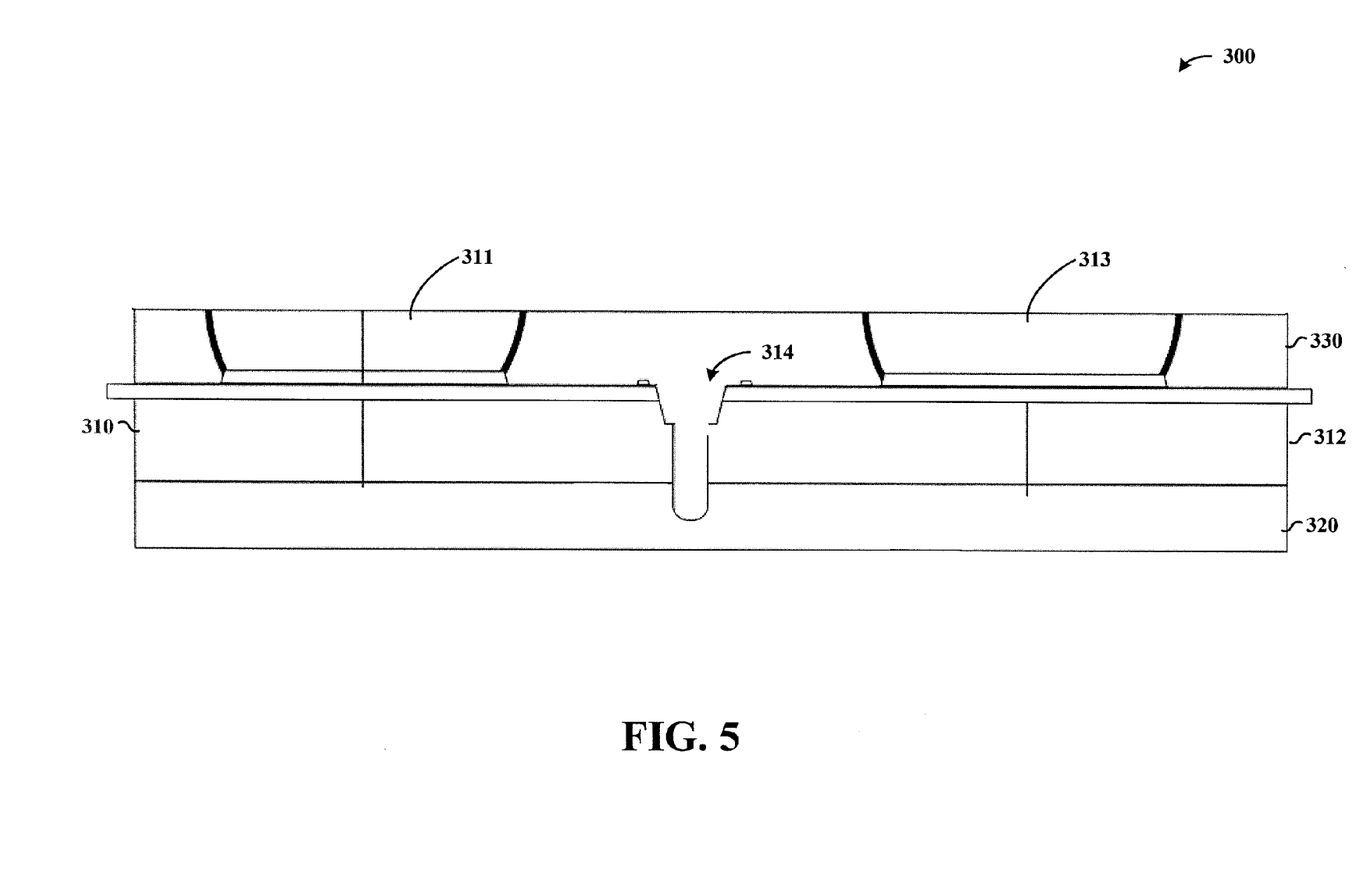
FIG. 5 shows the apparatus of FIG. 4 at another stage of manufacture, in accordance with one or more embodiments.

FIG. 4 shows the apparatus 300 of FIG. 3 at another stage of manufacture in which the mold material 330 and contacts 311 and 313 have been thinned/ground, in accordance with one or more embodiments. FIG. 5 shows the apparatus 300 of FIG. 4 at another stage of manufacture in which the mold material and contacts 311/313 have been further thinned/ground, as has mold material 320, in accordance with one or more embodiments. This approach may involve alternately grinding small portions of each mold material, to provide relatively balanced support on opposing sides of the integrated circuit dies 310 and 312. In various implementations, the contacts 311/313 are re-flown, which may result in the contacts forming a sphere-like upper surface, as may be similar to that shown in FIG. 6.

Figure 6:
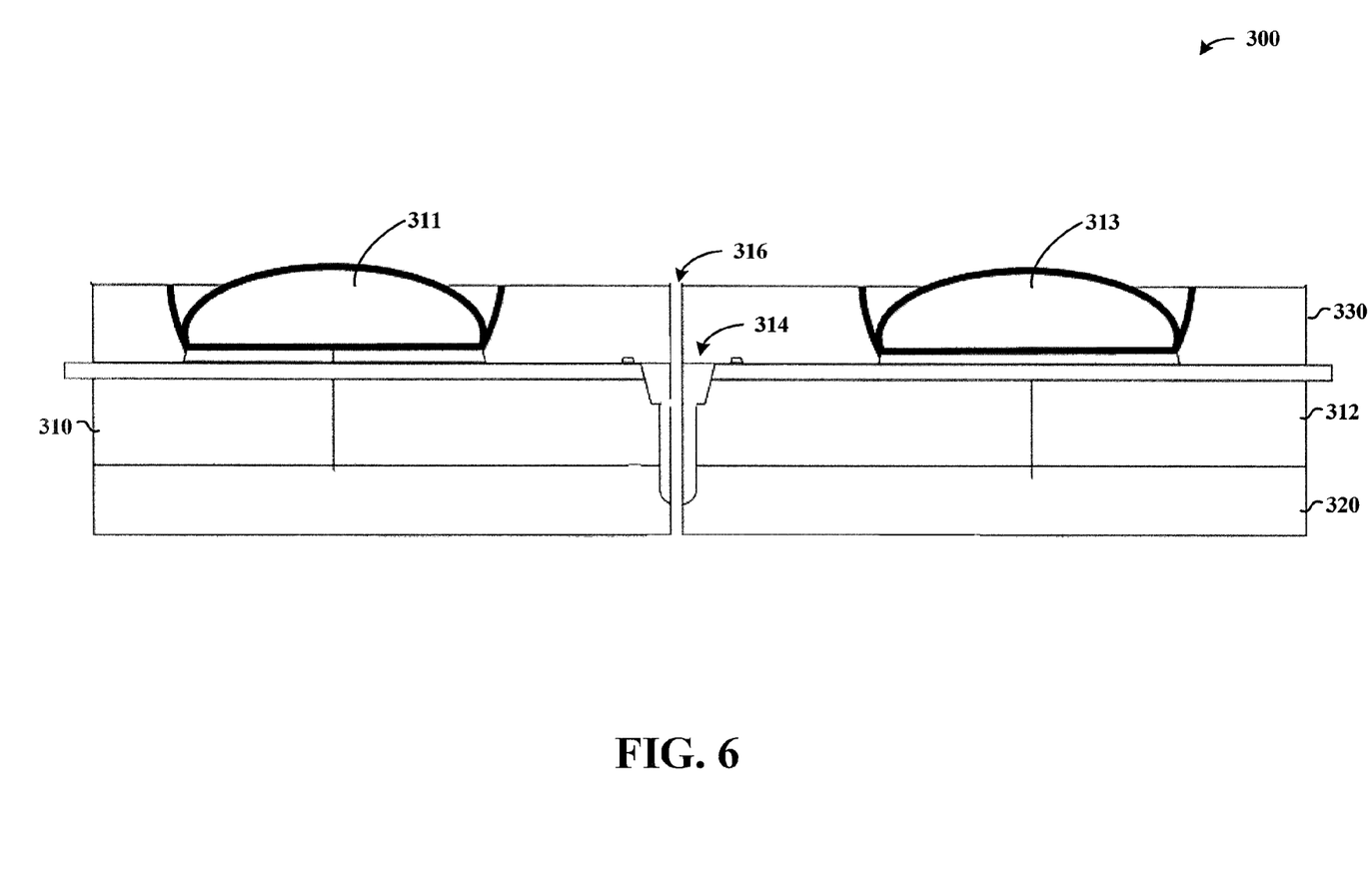
FIG. 6 shows the apparatus of FIG. 5 at another stage of manufacture, in accordance with one or more embodiments.

In FIG. 6, the apparatus 300 of FIG. 5 is shown at another stage of manufacture, in accordance with one or more embodiments. The contacts 311 and 313 may be reflowed, and a further saw lane 316 has been created which extends through the mold material 330 and 320, via the saw lane 314. Reflowing in this context may, for example, facilitate grinding/thinning the contacts and the mold material 330 to a common surface, then reflowing the contacts such that they protrude above the surface.

Figure 7:
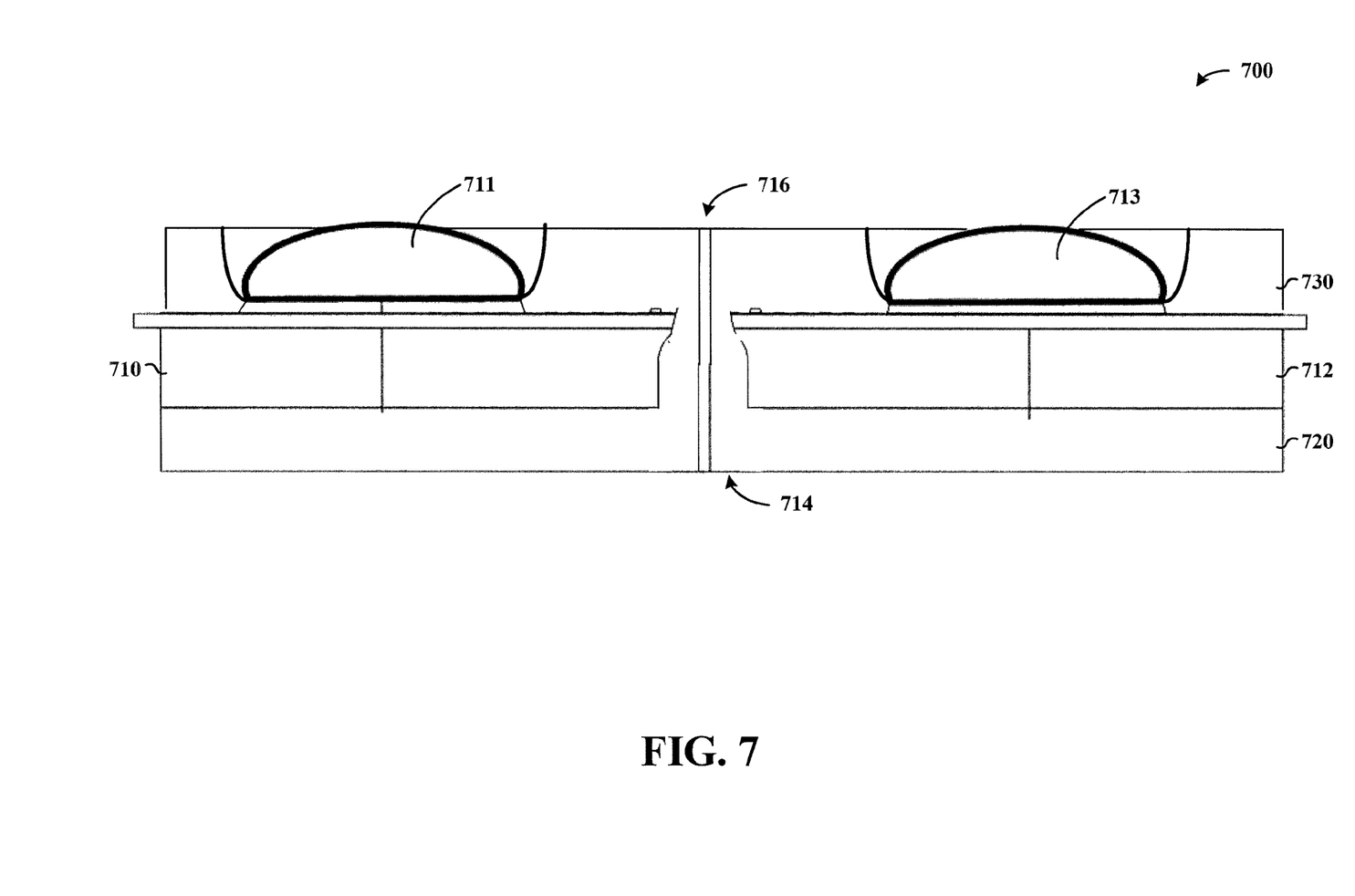
FIG. 7 shows an apparatus, in accordance with one or more embodiments.

FIG. 7 shows an apparatus 700, in accordance with one or more embodiments. The apparatus 700 may be manufactured with componentry and processes similar to those characterized in FIGS. 3-6, with a saw lane 714 formed from a lower mold material 720. For instance, respective grinding processes may be carried out using mold material 730 (e.g., at a thickness greater than that shown) to hold integrated circuit dies 710 and 712 while the saw lane 714 is made in mold material 720. One or both of the mold materials 720 and 730 can be ground to the final thickness shown, after formation of the saw lane 714. Contacts 711 and 713 are shown having been reflown, and a further optional saw lane 716 is also shown.

Various blocks, modules or other circuits may be implemented to carry out one or more of the operations and activities described herein and/or shown in the figures. In these contexts, a "block" (also sometimes "logic circuitry" or "module") is a circuit that carries out one or more of these or related operations/activities (e.g., molding, reducing thickness, or separating). For example, in certain of the above-discussed embodiments, one or more modules are discrete logic circuits or programmable logic circuits configured and arranged for implementing these operations/activities, as may be carried out in the approaches shown in FIGS. 1A-1E. In certain embodiments, such a programmable circuit is one or more computer circuits programmed to execute a set (or sets) of instructions (and/or configuration data). The instructions (and/or configuration data) can be in the form of firmware or software stored in and accessible from a memory (circuit). As an example, first and second modules include a combination of a CPU hardware-based circuit and a set of instructions in the form of firmware, where the first module includes a first CPU hardware circuit with one set of instructions and the second module includes a second CPU hardware circuit with another set of instructions (e.g., as may be implemented to control manufacturing tools).

Based upon the above discussion and illustrations, those skilled in the art will readily recognize that various modifications and changes may be made to the various embodiments without strictly following the exemplary embodiments and applications illustrated and described herein. For example, methods as exemplified in the Figures may involve steps carried out in various orders, with one or more aspects of the embodiments herein retained, or may involve fewer or more steps. For instance, final encapsulation can be carried out using mold material formed at various stages. A variety of types of adhesive material/tape may be used, such as dicing tape or grinding tape. Also, the reference to "first" and "second" components does not connote that the adjective "first" or "second" have any meaning whatsoever except for antecedent to differentiate ones recited item from another (e.g., "first mold" and "second mold"). Apparatuses as characterized herein may include fewer or additional components/material. Such modifications do not depart from the true spirit and scope of various aspects of the invention, including aspects set forth in the claims.

What is claimed is:

1. A method comprising:
   affixing an adhesive material to a first surface of a semiconductor wafer having a plurality of integrated circuit dies, the semiconductor wafer having a second surface opposite the first surface and a thickness between the first and second surfaces;
   reducing the thickness of the semiconductor wafer by grinding the second surface of the semiconductor wafer while using the adhesive material to support the first surface of the semiconductor wafer;
   after grinding the second surface, molding a first mold material onto the second surface while using the adhesive material to support the first surface of the semiconductor wafer;
   after molding the first mold material on to the second surface, separating the integrated circuit dies while using the first mold material to support the integrated circuit dies; and
   after separating the integrated circuit dies, molding a second mold material on the first surface of the semiconductor wafer.

2. The method of claim 1, further including mitigating warpage of the semiconductor wafer by grinding the first mold material to a thickness based upon a stiffness and thickness of the adhesive material, therein balancing support provided to the second surface by the first mold material with support provided to the first surface by the adhesive material.

3. The method of claim 1, further including mitigating warpage of the semiconductor wafer by providing the first mold material with a thickness and stiffness based upon a stiffness and thickness of the adhesive material, therein balancing support provided to the second surface by the first mold material with support provided to the first surface by the adhesive material.

4. The method of claim 1, wherein affixing the adhesive material and molding the first mold material include mitigating warpage of the semiconductor wafer by balancing support provided to the second surface by the first mold material with support provided to the first surface by the adhesive material, via respective thicknesses and stiffness of the adhesive material and of the first mold material.

5. The method of claim 1, wherein affixing the adhesive material includes selecting a stiffness and thickness of the adhesive material based upon a stiffness and thickness of the first mold material to be applied, and therein balancing support provided to the first surface by the adhesive material with support provided to the second surface by the first mold material.

6. The method of claim 1, wherein separating the integrated circuit dies while using the first mold material to support the integrated circuit dies includes using the first mold material to hold the integrated circuit dies in place while sawing the semiconductor wafer, therein mitigating warpage and cracking of the integrated circuit dies.

7. The method of claim 1, wherein separating the integrated circuit dies while using the first mold material to support the integrated circuit dies includes sawing through the semiconductor wafer along saw lanes between the integrated circuit dies, without sawing through the first mold material and therein using the first mold material to continue to hold the integrated circuit dies in place after sawing.

8. The method of claim 1, wherein the adhesive material, the first mold material and the second mold material have coefficients of thermal expansion (CTE) that are about equal, and wherein the semiconductor wafer has a CTE that is different than the CTE of the adhesive material and of the first and second mold materials.

9. The method of claim 1, further including, after molding the first mold material and before separating the integrated circuit dies, removing the adhesive material.

10. The method of claim 1, wherein molding the second mold material on the first surface of the semiconductor wafer includes encapsulating the integrated circuit dies with an epoxy mold compound by molding the second mold material along sidewalls of the integrated circuit dies, including molding the second mold material in gaps in the semiconductor wafer created by the separating.

11. The method of claim 1, wherein cutting lanes in the semiconductor wafer includes using the adhesive material to support the integrated circuit dies as they are cut, further including removing the adhesive material after cutting the lanes.

12. The method of claim 1, wherein molding the second mold material includes forming the second mold material in saw lanes between the integrated circuit dies and extending into the first mold material.

13. The method of claim 1, wherein reducing the thickness of the semiconductor wafer includes reducing the thickness of the semiconductor wafer to a thickness that is less than a thickness of the adhesive material.

14. The method of claim 1, wherein affixing adhesive material to the first surface of the semiconductor wafer includes affixing adhesive material to electrical contacts protruding from a substrate of the semiconductor wafer.

15. A method comprising:
providing a semiconductor wafer having a plurality of integrated circuit dies and first and second opposing surfaces, the second surface of the semiconductor wafer being ground;
applying a first mold compound on the ground second surface;
separating the integrated circuit dies along saw lanes between the integrated circuit dies while holding the integrated circuit dies in place with the first mold compound; and
encapsulating the integrated circuit dies with the first mold compound and a second mold compound by applying the second mold compound to the first surface and along sidewalls of the integrated circuit dies, including sidewalls in the saw lanes.

16. The method of claim 15, further including reducing a thickness of the semiconductor wafer by grinding the second surface of the semiconductor wafer while using adhesive material on the first surface of the semiconductor wafer to support the semiconductor wafer.

17. The method of claim 16, wherein applying the first mold compound to the ground second surface includes mitigating warpage of the semiconductor wafer by setting a stiffness of the first mold compound, relative to stiffness of the adhesive material, to provide balanced support respectively to the first and second surfaces of the semiconductor wafer.

18. The method of claim 15, wherein applying the first and second mold compounds include forming or grinding the respective mold compounds with thicknesses that are about equal.

* * * * *